(12) United States Patent
Boeve

(10) Patent No.: US 7,539,045 B2
(45) Date of Patent: May 26, 2009

(54) METHOD AND DEVICE FOR IMPROVED MAGNETIC FIELD GENERATION DURING A WRITE OPERATION OF A MAGNETORESISTIVE MEMORY DEVICE

(75) Inventor: Hans Marc Bert Boeve, Eindhoven (NL)

(73) Assignee: NXP B.V., Eindhoven (NL)

( * ) Notice: Subject to any disclaimer, the term of this patent is extended or adjusted under 35 U.S.C. 154(b) by 697 days.

(21) Appl. No.: 10/536,293

(22) PCT Filed: Nov. 6, 2003

(86) PCT No.: PCT/IB03/05059

§ 371 (c)(1),
(2), (4) Date: May 25, 2005

(87) PCT Pub. No.: WO2004/049344

PCT Pub. Date: Jun. 10, 2004

(65) Prior Publication Data

US 2006/0023491 A1    Feb. 2, 2006

(30) Foreign Application Priority Data

Nov. 28, 2002  (EP)  .................... 02080005

(51) Int. Cl.
*G11C 11/02* (2006.01)

(52) U.S. Cl. ............... 365/158; 257/422; 257/E27.006; 365/61; 365/66; 365/173

(58) Field of Classification Search ............ 365/158, 365/63, 61, 66, 157, 171, 173; 257/421, 257/422, E21.665, E27.006
See application file for complete search history.

(56) References Cited

U.S. PATENT DOCUMENTS

| | | | |
|---|---|---|---|
| 4,473,893 A * | 9/1984 | Zierhut et al. | 365/87 |
| 5,587,943 A * | 12/1996 | Torok et al. | 365/158 |
| 5,732,016 A | 3/1998 | Chen et al. | |
| 5,894,447 A | 4/1999 | Takashima | |
| 6,104,632 A * | 8/2000 | Nishimura | 365/158 |
| 6,236,590 B1 * | 5/2001 | Bhattacharyya et al. | 365/173 |
| 6,335,890 B1 * | 1/2002 | Reohr et al. | 365/225.5 |
| 6,385,083 B1 * | 5/2002 | Sharma et al. | 365/171 |
| 6,778,427 B2 * | 8/2004 | Odagawa et al. | 365/158 |
| 6,816,402 B2 * | 11/2004 | Deak | 365/158 |
| 2001/0040819 A1 * | 11/2001 | Hayashi et al. | 365/158 |

* cited by examiner

*Primary Examiner*—Anh Phung
*Assistant Examiner*—Michael Lulis

(57) ABSTRACT

Magnetic or magnetoresistive random access memories (MRAMs) are implemented in a variety of arrangements and methods. Using one such arrangement, a matrix is implemented with magnetoresistive memory cells logically organized in rows and columns, each memory cell including a magnetoresistive element. The matrix has a set of column lines, a column line being a continuous conductive strip which is magnetically coupled to the magnetoresistive element of each of the memory cells of a column, wherein each column line has a forward column line and a return column line arranged on opposite sides of the magnetoresistive element and offset from one another for forming a return path for current in that column line.

12 Claims, 9 Drawing Sheets

(a) (b) (c) (d) (e)

METHOD AND DEVICE FOR IMPROVED MAGNETIC FIELD GENERATION DURING A WRITE OPERATION OF A MAGNETORESISTIVE MEMORY DEVICE

The present invention relates to magnetic or magnetoresistive random access memories (MRAMs), and more particularly to a method and a device for modulating a generated magnetic field during a write operation of such a magnetoresistive memory device.

Magnetic or Magnetoresistive Random Access Memory (MRAM) is currently being considered by many companies as a successor to flash memory. It has the potential to replace all but the fastest static RAM (SRAM) memories. It is a non-volatile memory device, which means that no power is required to sustain the stored information. This is seen as an advantage over most other types of memory.

The MRAM concept was originally developed at Honeywell Corp. USA, and uses magnetization direction in a magnetic multilayer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize a.o. non-volatile magnetic memories. These devices comprise a stack of thin films of which at least two are ferromagnetic or ferrimagnetic, and which are separated by a non-magnetic interlayer. GMR is the magneto-resistance for structures with conductor interlayers and TMR is the magneto-resistance for structures with dielectric interlayers. If a very thin conductor is placed between two ferromagnetic or ferrimagnetic films, then the effective in-plane resistance of the composite multilayer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 6-9% magneto-resistance in good GMR cells.

An MRAM comprises a plurality of magnetoresistive memory units 1 arranged in an array. One such prior art memory unit 1 is shown in FIG. 1. Each memory unit 1 comprises a magnetoresistive memory element 2, a first intersection of a digit line 4 and a bit line 6, and a second intersection of the bit line 6 and a word line 8. The memory units 1 are coupled in series in columns by means of the bit lines 6 and coupled in series in rows by means of the digit lines 4 and word lines 8, thus forming the array. The magnetoresistive memory elements 2 used may for example, but not limited thereto, be magnetic tunnel junctions (MTJs).

MTJ memory elements 2 generally include, as shown in FIG. 2, a layered structure comprising a fixed or pinned layer 10, a free layer 12 and a dielectric barrier 14 in between. The MTJ memory element 2 furthermore comprises a non-magnetic conductor forming a lower electrical contact 22, and an upper contact 16 on e.g. the free magnetic layer 12. The stack of free and pinned layers can also be reversed, so that the upper contact is on the pinned magnetic layer. The pinned magnetic layer 10 and the free magnetic layer 12 may both be composed of e.g. NiFe, and the dielectric barrier layer 14 may e.g. be made of AlOx. Moreover both free and pinned layers can be formed by a multilayer of different magnetic layers, also in combination with non-magnetic or antiferromagnetic layers. By applying a small voltage over the sandwich of ferromagnetic or ferrimagnetic layers 10, 12 with the dielectric 14 therebetween, electrons can tunnel through the dielectric barrier 14.

The pinned layer 10 of magnetic material has a magnetic vector that always points in the same direction. The magnetic vector of the free layer 12 is free, but constrained by the physical size of the layer, to point in either of two directions: parallel or anti-parallel with the magnetization direction of the pinned layer 10.

An MTJ memory element 2 is used by connecting it in a circuit such that electricity can flow vertically through the element 2 from one of the magnetic layers to the other. The MTJ unit 1 can be electrically represented by a resistor R in series with a switching element such as a transistor T, as shown in FIG. 1. The size of the resistance of the resistor R depends on the orientation of the magnetic vectors of the free and pinned magnetic layers of the memory element 2. The MTJ element 2 has a relatively high resistance (HiRes) when the magnetic vectors point in opposite directions, and it has a relatively low resistance (LoRes) when the magnetic vectors point in the same direction.

A diagrammatic elevational view of a 2×2 array of prior art memory units is shown in FIG. 2. In an MRAM array, comprising a plurality of MRAM units, orthogonal conductive lines 4, 6 pass under and over each bit or memory element 2, carrying current that produces a switching field. Each bit is designed so that it will not switch when current is applied to just one line, but will switch when current is flowing through both lines 4, 6 that cross at the selected bit (switching will occur only if the magnetic vector of the free layer is not in accordance with the direction of the switching field).

Digit lines 4 and bit lines 6 are provided in an array of MTJ memory units 1, where the digit lines 4 travel along the rows of the array on one side of the memory elements 2, and the bit lines 6 travel down the columns of the array on the opposite side of the memory elements 2. The structure in FIG. 2 is partially inverted for clarity purposes: digit lines 4 physically run underneath the MTJ elements 2 (at that side of the MTJ elements 2 oriented towards the substrate in which the transistor T is provided), and bit lines 6 physically run over the MTJ elements 2 (at that side of the MTJ elements 2 oriented away from the substrate in which the transistor T is provided). However, if drawn that way, the bit lines 6 would obscure the magnetoresistive elements 2, which are the more relevant parts of the drawing.

The memory element 2 is connected to the transistor T by means of an interconnect layer 16 and a plurality of metalization layers 18 and vias 20. There is a galvanic connection 22 between the memory element 2 and the bit line 6. The transistor T of each memory unit 1 is connected to a ground line 24.

In write or program mode, required currents flow through selected digit lines 4 and bit lines 6 so that at their intersection a peak magnetic field is generated, sufficient to switch the polarization of the free layer 12 of the MTJ element 2, so as to switch the resistance of the MTJ unit 2 from the LoRes (low resistance) state to the HiRes (high resistance) state or vice versa (depending on the direction of the current through the bit line 6). At the same time, the switching element such as transistor T in the selected memory unit 1 (the memory unit at the intersection of the selected digit line 4 and the selected bit line 6) is in the cut-off state, for example by keeping the voltage on the word line 8 low (0 volt in case the switching element is a transistor T). The currents in the selected digit line 4 and the selected bit line 6 are such that together they provide a magnetic field able to change the direction of the magnetic vector of the free layer of the selected memory element, but the current in either strip by itself is not able to change the storage state. Therefore only the selected memory element is written, not any of the other memory elements on the same selected digit line 4 or bit line 6.

A disadvantage with MRAM is that the programming current needed is very high, because of the requirement of two high enough magnetic fields being induced in the neighborhood of the magnetoresistive material. In demos by IBM and Motorola, 0.6 μm CMOS technology proves to give stable read and write operations using currents in the 5 to 10 mA range. Typical devices in these demonstrations were about 0.1 to 0.5 μm$^2$.

Scaling of RAM technology into the sub-100 nm area is desirable in order to get smaller memories, but it is not straightforward. Magnetic elements typically have some aspect ratio to stabilize favorable magnetization directions by shape anisotropy. However, smaller dimensions lead to increasing switching fields for a fixed aspect ratio. Therefore, the aspect ratio should be reduced for smaller devices. On the other hand, long-term thermal stability, i.e. data retention, requires a certain minimal energy barrier ($K_uV$) against switching, which is basically setting a minimum value for the switching field ($\sim K_u$).

Magnetic fields are created on-chip by sending a current through bit or word lines, in general called current lines, and are proportional to the current. For obtaining higher magnetic fields, higher currents need to be used. However, low power applications will require low currents. Those are contradictory requirements. Scaling laws are also applied to the current lines, in particular to their cross-section. The current density in a current line is limited to $\sim10^7$ A/cm$^2$, a typical electromigration limit for Cu. At higher current densities, metal atoms migrate in the current line, resulting in a break in the metal line. The above-mentioned limit sets an upper limit to the current in a Cu current line to 1 mA per 100 nm×100 nm section. In other words, the magnetic field amplitude which can be generated when scaling down prior art magnetoresistive memory devices is limited.

U.S. Pat. No. 6,385,083 allegedly solves this problem by providing, for each memory element, a bit line and a plurality of word lines. Currents through these lines all contribute to the magnetic field for a selected memory cell. By this solution, for a same conductor or current line size and current density, significantly higher write fields (magnetic fields) are obtained. In the alternative, for a same write field, current density in the write lines can be decreased, which reduces electromigration problems. However, each of the word lines is driven by a row driver, and therefore the total power consumption is increased, which is undesirable in low power applications.

It is an object of the present invention to improve magnetic field generation in a magnetic memory.

For example, improved magnetic field generation may include: generating a higher magnetic field for a given current density and/or decreasing cross-talk to neighboring, non-selected memory cells, and/or creating a better uniformity of the magnetic field throughout the memory device.

The above objective is accomplished by a device and method according to the present invention.

For a fixed technology, i.e. the geometry of current lines and storage elements is fixed, it is proposed to use "active write field shaping" by creating at least one particular magnetic field component from currents in multiple current lines, rather than only one current line, wherein the multiple current lines comprise at least a normal current line and a current line functioning as a return path for the current. With "active write field shaping" is meant that the magnetic field profile can be locally changed, or shaped, by addition of magnetic field profiles from multiple current lines. Active write field shaping may therefore be described as multi-source magnetic field generation. According to the present invention, the field created from the return path is used to increase the magnetic field and/or reduce cross-talk. As the current line functioning as a return path adds to generate a magnetic field component in a selected memory element, it is called a "functional return path" in the current disclosure.

The present invention provides a matrix with magnetoresistive memory cells logically organized in rows and columns, each memory cell including a magnetoresistive element. The matrix comprises a set of column lines, a column line being a continuous conductive strip which is magnetically couplable to the magnetoresistive element of each of the memory cells of a column, wherein for each column line, at least one return column line is provided for forming a return path for current in that column line and for adding to a magnetic field influencing a selected magnetoresistive element and generated by current flow in the column line for increasing the magnetic field for writing to the selected magnetoresistive element. The matrix may further comprise a set of row lines, a row line being a continuous conductive strip which is magnetically couplable to the magnetoresistive element of each of the memory cells of a row. A combined magnetic field generated by current through a row line corresponding to a selected memory cell, by current through a column line corresponding to the selected memory cell, and by current through the corresponding return column line is sufficiently high for switching (dependent on the content of the memory cell) the magnetic status of the magnetoresistive element of the selected memory cell. A magnetic field generated by current through any of the named current lines is not high enough to provide a switching field. It is an advantage of the present invention that lower current levels can be sent through the row line, column line and return line, while still a switching field is generated. The matrix according to the present invention allows realization of higher magnetic fields at maximum current density, which allows postponement of the fundamental thermal stability limit when scaling to smaller dimensions. Advantages include at least one of low power, possibility to reduce cross-talk in neighboring elements, possibility to improve magnetic field amplitude throughout the magnetic storage element.

The present invention is described with a column line having a return line, but "row lines" and "column lines" are names given for ease of reference only, and may be, but do not necessarily refer to the physical orientation of those lines.

In one embodiment, a return column line may be one of the other column lines. This has the advantage that no separate current lines need to be provided.

In another embodiment, the return column lines are different from the column lines. This means that separate current lines need to be provided, but it has the advantage that parallel writing to a plurality of columns is possible. For each column line, a return column line may be provided at opposite sides of a column of magnetoresistive elements.

According to one embodiment, the column of magnetoresistive elements may be placed offset in a row-direction with regard to the center of the column lines. According to another embodiment, the column of magnetoresistive elements may be placed offset in a row-direction with regard to the center of the return column lines. According to yet another embodiment, the column of magnetoresistive elements may be placed symmetrically with regard to both the column line and at least one return column line. These different configurations all lead to different maximum obtainable magnetic fields, different power consumption and different power efficiency.

The present invention also provides that not only each column line is provided with at least one return column line, but that also each row line is provided with at least one return row line for forming a return path for current in that row line and for adding to the magnetic field of a selected magnetoresistive element.

According to yet another embodiment of the present invention, the column lines and/or the return column lines and/or the row lines and/or the return row lines are provided with a flux guiding cladding layer. An advantage of such cladding layer is that the magnetic fields in the respective layers are more concentrated, and that cross-talk is reduced, hence unwanted programming is avoided.

The present invention also provides a nonvolatile memory comprising a matrix with magnetoresistive memory cells according to any of the previous claims. This memory may be a memory with multiple banks or modules. Such nonvolatile memory may be used e.g. in microprocessors, in computers, in mobile telephones, in printers, in microcontrollers, as a memory in smartcards, or for any other suitable application. Such nonvolatile memory may also replace optical storage. The data is stored in the MRAM, and reading occurs with a special designated magnetic reading head.

The present invention furthermore provides a method of writing a magnetoresistive element in a matrix of magnetoresistive memory elements arranged in logically organized rows and columns. The method comprises combining, in the magnetoresistive element, a magnetic field from a current line with a magnetic field from at least one return current line to thereby increase the magnetic field for writing to the magnetoresistive element. An advantage of the method of the present invention is that lower currents can be sent in the current lines to obtain a magnetic field sufficient to write a value in a magnetoresistive element. The total magnetic field from at least three different current lines is used, of which at least two, forming one of the magnetic field components, are sharing the same current source, i.e. so that one forms a current path and the other forms a return current path.

Due to the fact that a current path and a return current path are provided, only single-polarity current sources are needed for row and/or column drivers.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 10:
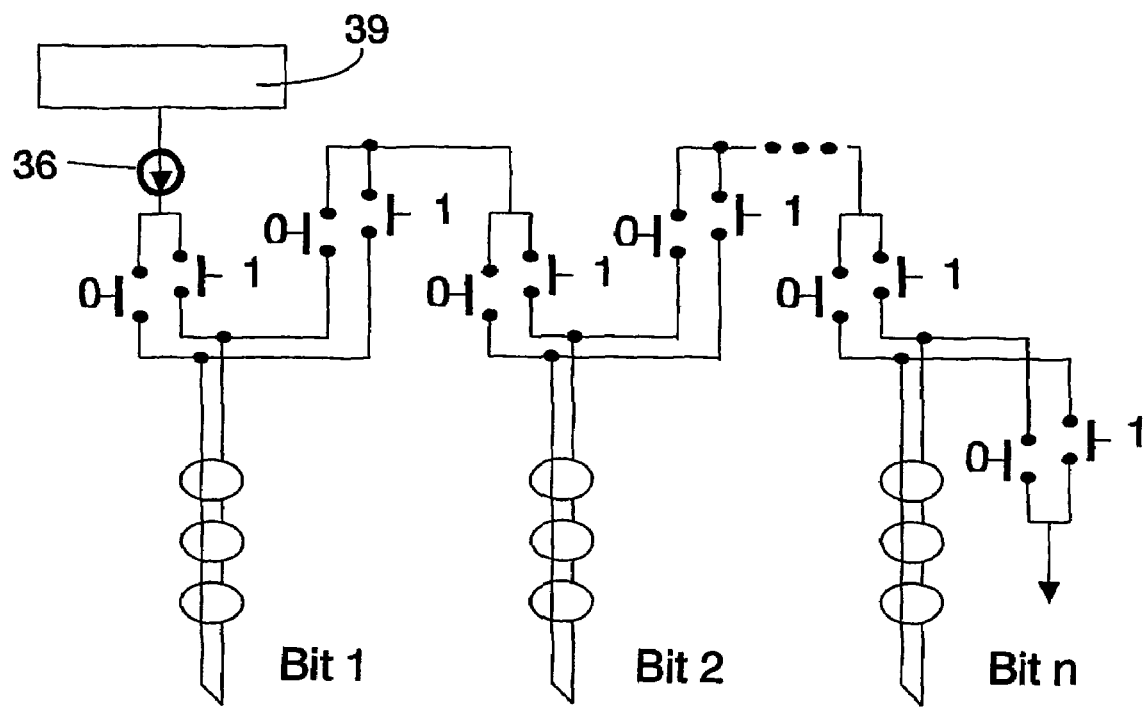
Figure 10:
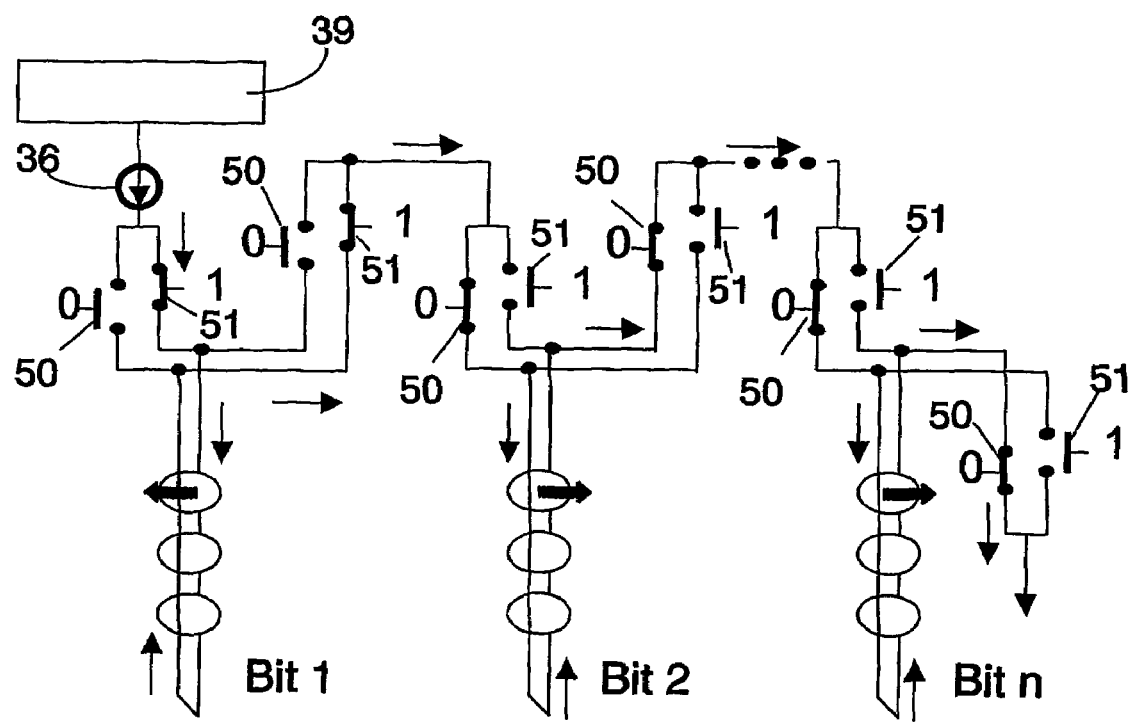

FIG. 10 schematically illustrates a serial single current source word-parallel MRAM.

Figure 11:
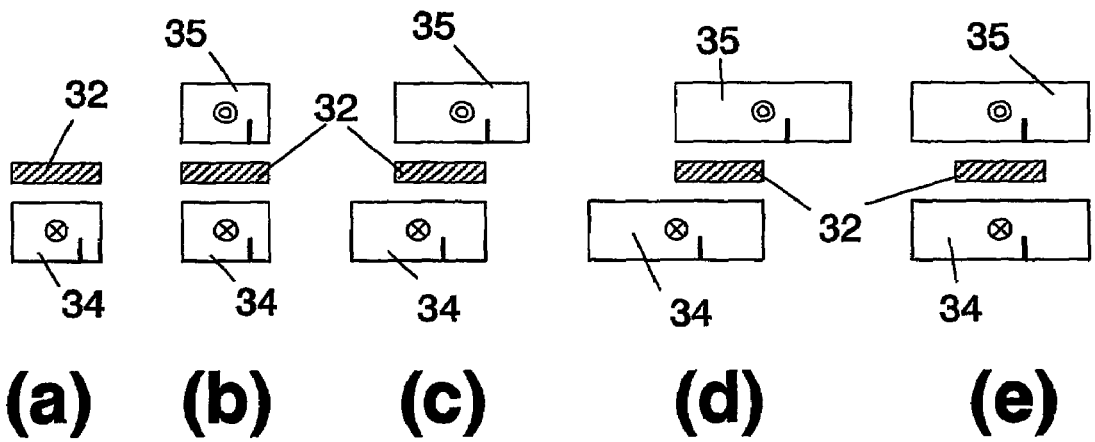

FIG. 11 illustrates different embodiments ((b) to (e)) of active field shaping according to the present invention, compared to the prior art situation (a).

Figure 12:
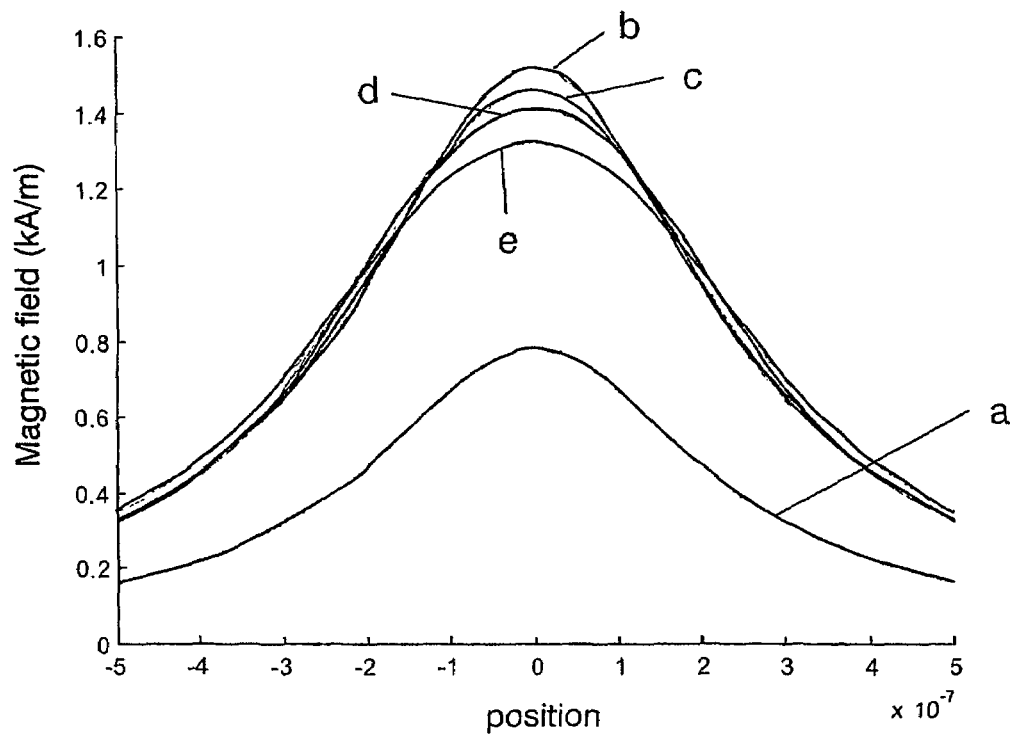

FIG. 12 is a graph of the calculated magnetic fields for the different embodiments of FIG. 11.

Figure 13:
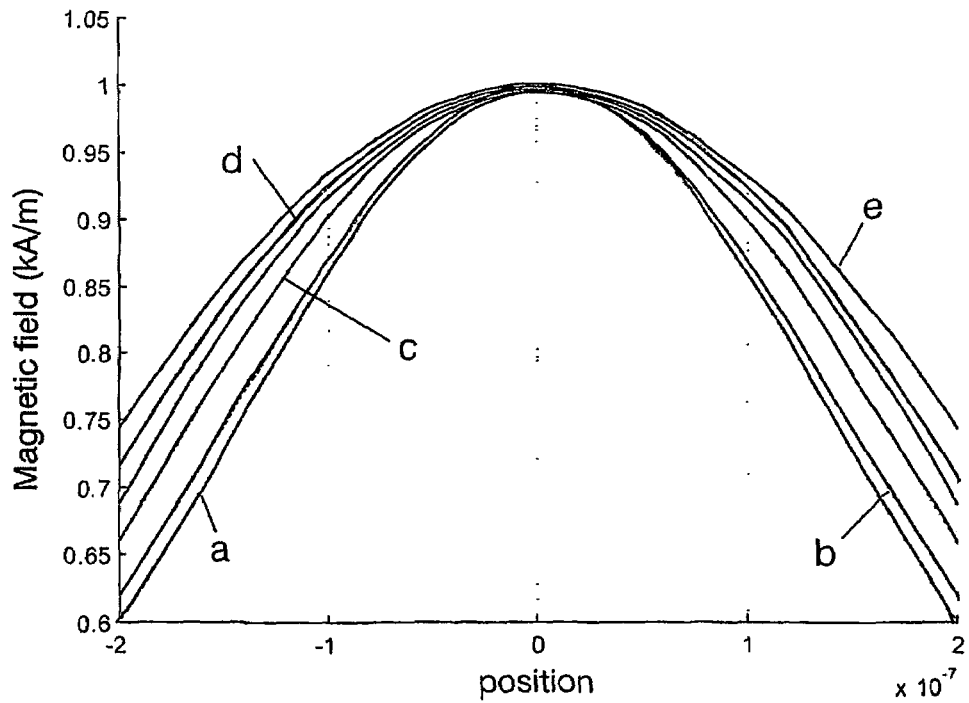

FIG. 13 is a graph of a normalized field uniformity throughout the tunnel junction for the different embodiments of FIG. 11.

Figure 14:
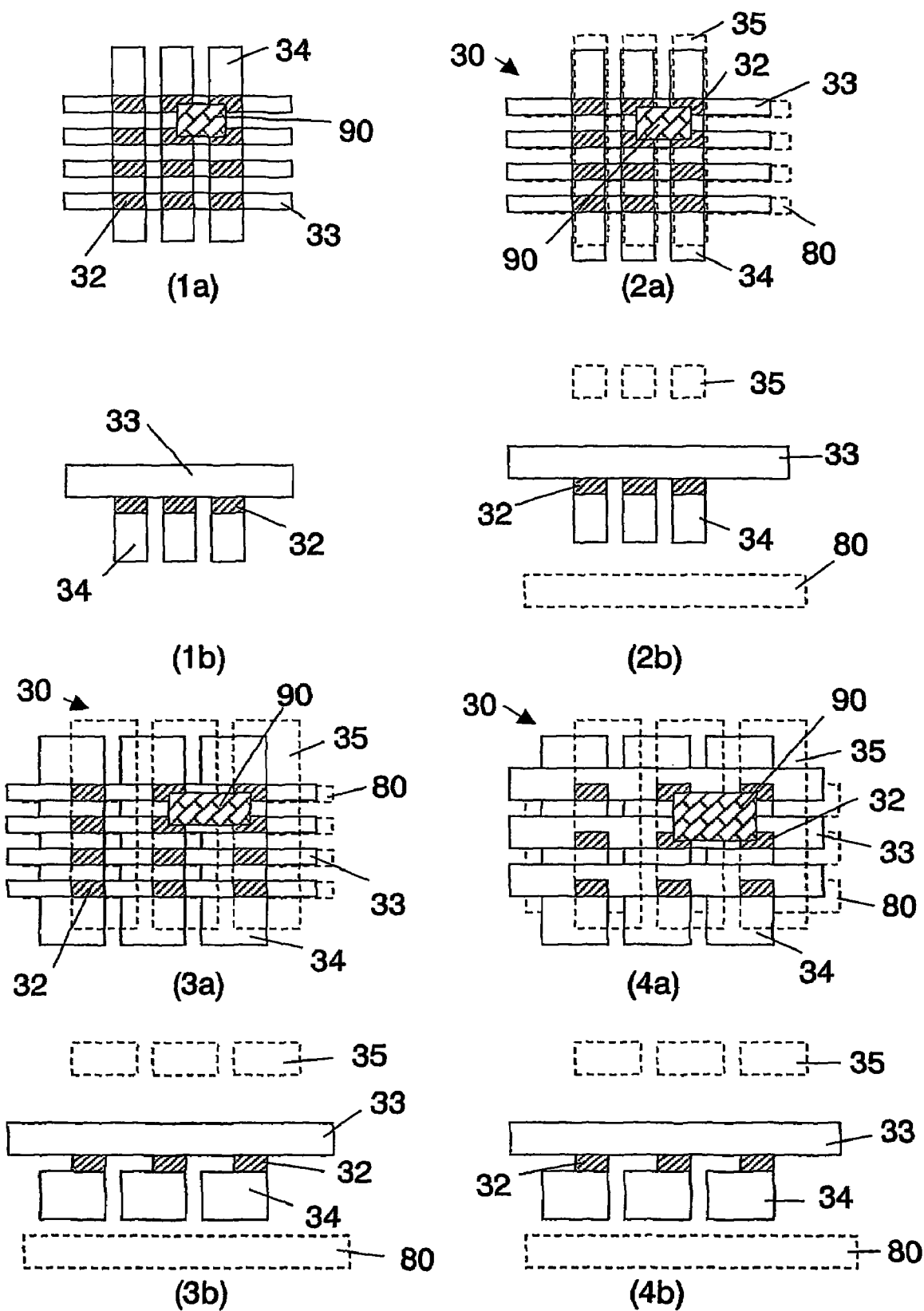

FIG. 14 illustrates different layouts of embodiments of current lines having functional return lines.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

According to the present invention, a matrix 30 of magnetoresistive memory cells 31, each memory cell 31 comprising a magnetoresistive memory element 32, is logically organized in rows and columns. Throughout this description, the terms "horizontal" and "vertical" are used to provide a co-ordinate system and for ease of explanation only. They do not need to, but may, refer to an actual physical direction of the device. Furthermore, the terms "column" and "row" are used to describe sets of array elements which are linked together. The linking can be in the form of a Cartesian array of rows and columns however the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organized rows and columns. By this is meant that sets of memory elements are linked together in a topologically linear intersecting manner however, that the physical or topographical arrangement need not be so. For example, the rows may be circles and the columns radii of these circles and the circles and radii are described in this invention as "logically organized" in rows and columns. Also, specific names of the various lines, e.g. bitline and wordline, or row line and column line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

Figure 3:
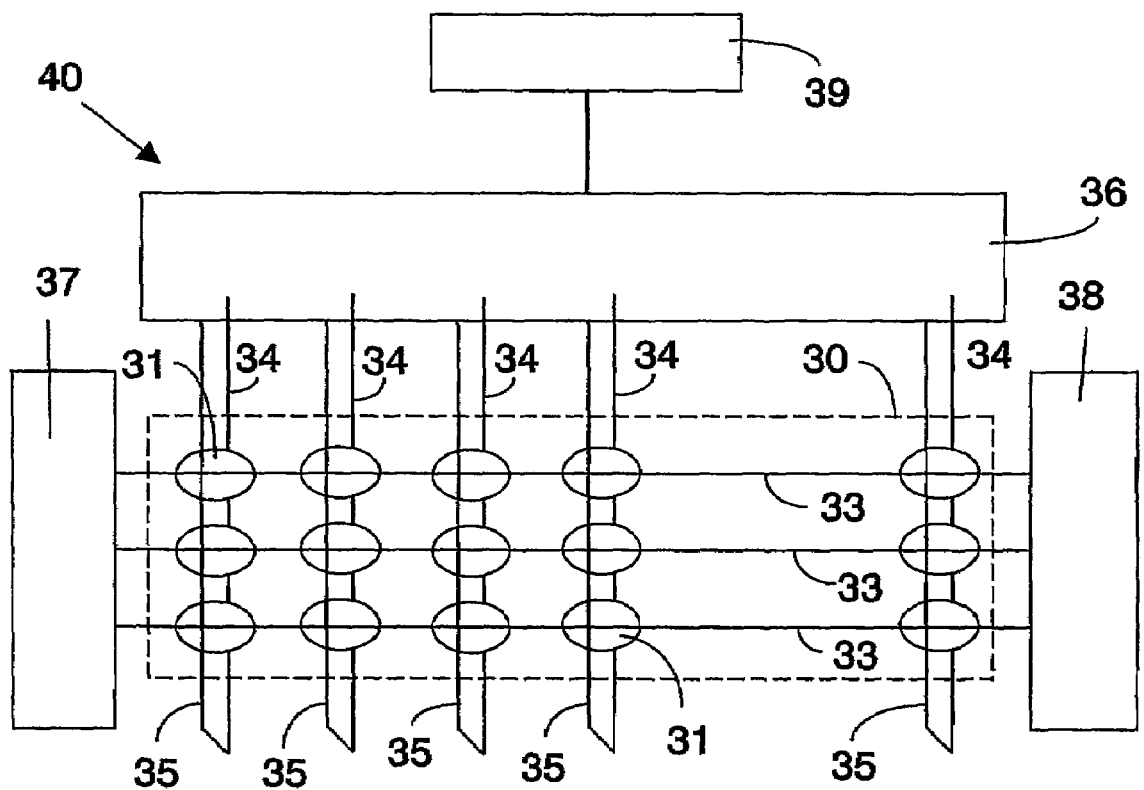
FIG. 3 is a schematic illustration of an MRAM architecture with a memory array, a single current source/sink unit for one of the magnetic field components, and a current return path according to a first embodiment of the present invention.

FIG. 3 is a diagrammatic illustration of a top view of an MRAM device 40, such as for example an MRAM array, a memory module, a memory bank or a memory consisting of several memory banks, according to a first embodiment of the present invention, comprising an array or matrix 30 of magnetoresistive memory elements 32, such as e.g. GMR or MTJ elements. The matrix 30 is provided with row lines 33 and column lines 34. A row line 33 is a continuous conductive strip, e.g. a copper line, which is magnetically couplable to the magnetoresistive elements 32 of a row of the matrix 30. A row line extends in a first direction. A column line 34 is a continuous conductive strip, e.g. a copper line, which is magnetically couplable to the magnetoresistive elements 32 of a column of the matrix 30. A column line 34 extends in a second direction. In the embodiment described, the second direction is perpendicular to the first direction. This, however, is an example only and is not limiting. For each column line 34, at least one corresponding return column line 35 is provided. This return column line 35 forms a functional return path for the current in the corresponding column line 34, i.e. the current from a column current source 36 through an appropriate column line 34 generates a first magnetic field in a selected magnetoresistive element 32 (as well as in all other magnetoresistive elements 32 of that column). This current is returned to a column current sink, which in the embodiment shown is physically the same element as the current source 36, through the at least one corresponding return column line 35, thus generating a second magnetic field in the selected magnetoresistive element 32 (as well as in all other magnetoresistive elements 32 of that column). According to another embodiment of the present invention (not represented in the drawings), it is also possible to provide separate current source and current sink devices. Furthermore, a current from a row current source 37 is sent through an appropriate row line 33 to a row current sink 38, thus generating a third magnetic field in the selected magnetoresistive element 32 (as well as in all other magnetoresistive elements 32 of that row). The combination of the first, second and third magnetic fields in the selected magnetoresistive element 32 provides a magnetic field able to change the direction of the magnetic vector of the free layer of this element 32, but either of the magnetic fields by itself or a combination of not all those magnetic fields, is not able to change the storage state. Therefore only the selected memory cell 31 is written. A power supply 39 provides the necessary power for generating the row currents and the column currents. Only a limited number of memory cells 31 are shown in FIG. 3, but in practice the memory array 30 can be of any size.

Figure 4:
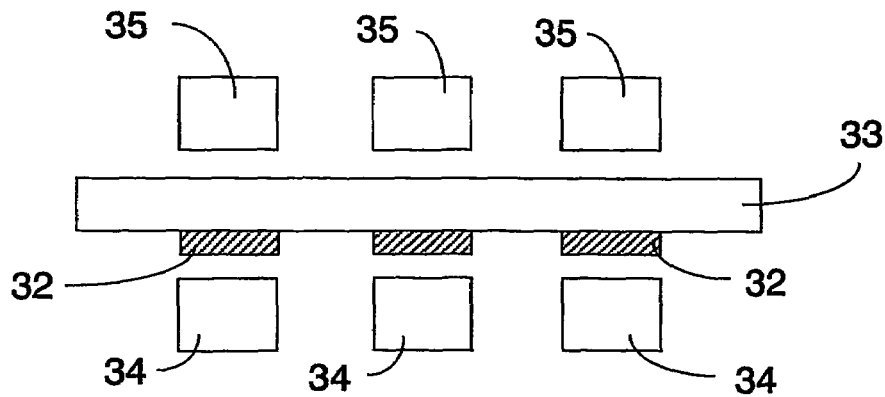
FIG. 4 is a schematic cross-section of part of the memory array of FIG. 3.

Reference is made to FIG. 4, which illustrates a cross-sectional view of the matrix 30 of FIG. 3, including an array of magnetoresistive memory cells 31, each memory cell 31 comprising a magnetoresistive memory element 32. The magnetoresistive memory elements 32 may include magnetoresistive devices such as tunneling magnetoresistive (TMR) devices or giant magnetoresistive (GMR) devices. The magnetoresistive memory cells 31 are arranged in rows and columns.

Figure 5:
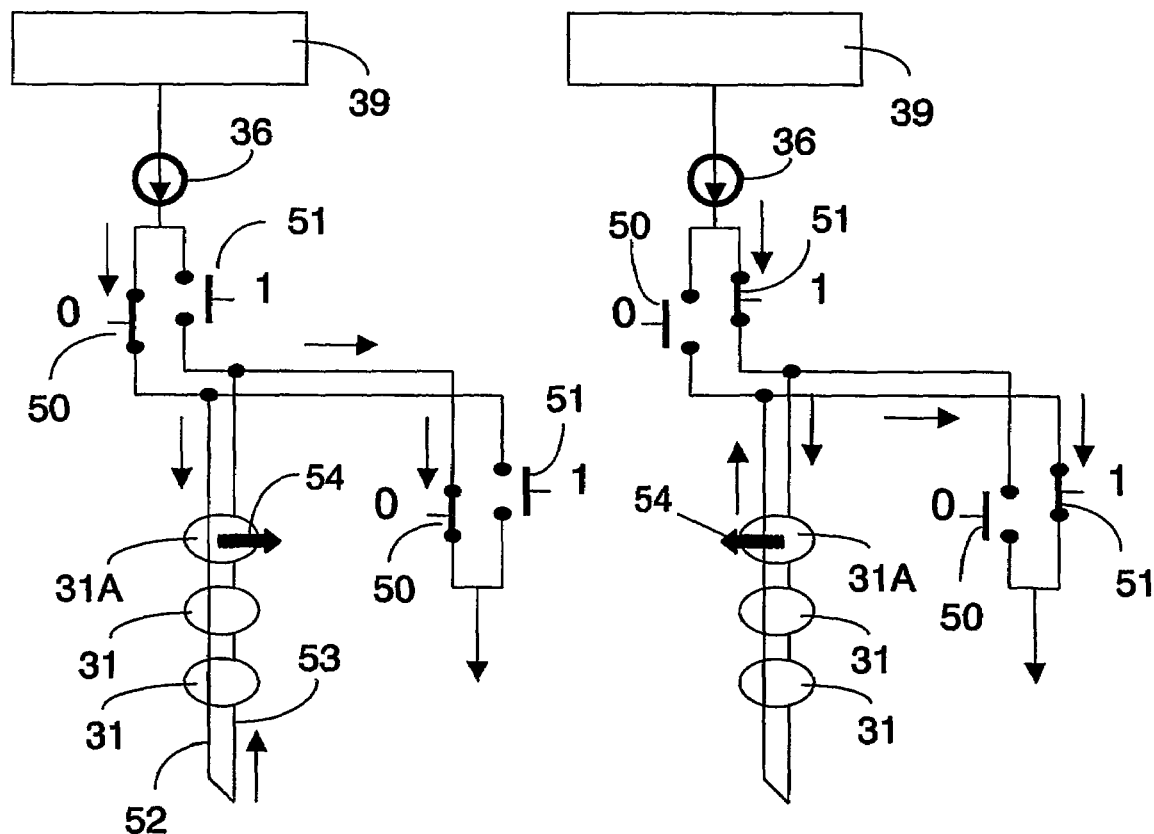
FIG. 5 is a schematic explanation of the creation of different current paths.

Row lines 33 extend in the first direction in a plane on one side of the array 30 of memory cells 31, for example on the top thereof. Column lines 34 extend in the second direction in a plane on the opposite side of the array 30 of memory cells 31, in the example given at the bottom side thereof. Furthermore, return path lines 35 are provided, extending in the second direction in a plane at the same side of the array of memory cells 31 as the row lines 33, i.e. in the example give on the top of the array 30. As the return current path forms a closed loop, a single current source/sink element 36 may be provided on one side of the memory matrix 30. By directing the current into the upper or lower conductor 34, 35 of the loop, a unipolar current source 36 can be utilized in combination with a couple of switches 50, 51 such as e.g. semiconductor switches, as shown in FIG. 5. FIG. 5 further clarifies the combination of switches 50, 51 to be selected in order to create different current source-to-sink paths for writing logical 0 (left-hand side of FIG. 5) and 1 (right-hand side of FIG. 5) values. Arrows for current path and closed switches are added for clarity.

If a first binary value, e.g. a 0-value, is to be written in memory element 32 of magnetoresistive memory cell 31A (selected cell), then the switches 50 are closed, while switches 51 are opened. For clarity purposes only, row lines 33 are omitted FIG. 5. However for switching a current must be present in the row line crossing memory cell 31A. Current coming from current source 36 is directed through a first switch 50, through a first column line 52 over the selected memory cell 31A, through a second column line 53 underneath the selected memory cell 31A, and back to a column current sink. This column current sink may or may not physically be the same element as column current source 36. The second column line 53 is a return column line. If a second binary value, e.g. a 1-value, is to be written in memory element 32 of magnetoresistive memory cell 31A (selected cell), then the switches 51 are closed, while switches 50 are opened. Current coming from current source 36 is directed through a first switch 51, through the second column line 53 underneath the selected memory cell 31A, through the first column line 53 above the selected memory cell 31A, and back to the column current sink. The column current sink may or may not physically be the same element as column current source 36. The first column line 53 now functions as a return column line. When thus changing the direction of the current through the first and second column lines 52, 53 by appropriately switching the switches 50, 51, the generated magnetic field in memory cell 31A switches direction, as represented by arrow 54 in FIG. 5.

Figure 6:
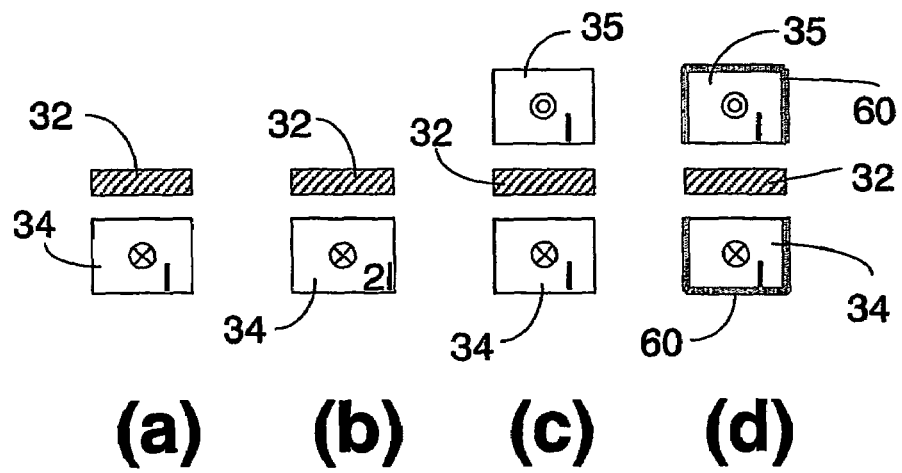
FIG. 6 illustrates write field gain for different embodiments having the same power efficiency.
Figure 7:
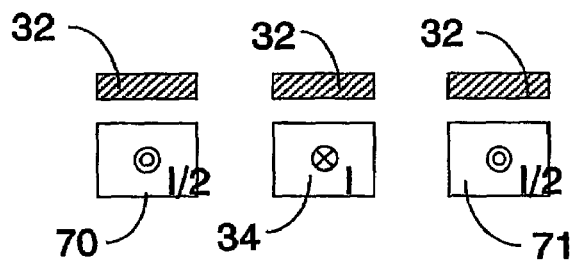
FIG. 7 illustrates a functional current return path according to a second embodiment of the present invention.

In FIG. 6, a comparison of different situations is made. Part (a) of FIG. 6 represents a prior art situation, in which only one column line 34 is provided for each memory element 32.

When the resistance of the current line 34 is fixed, e.g. R, it requires $R \cdot I^2$ to generate a field H in the memory element 32 of the prior art configuration, i.e. in a memory cell 31 with no current return path line provided for adding in generating a magnetic field in the memory element 32. If power efficiency is defined as the ratio between the power consumption to generate a magnetic field, and the generated magnetic field itself, the power efficiency for this prior art situation is $(R \cdot I^2)/H$. In order to double the magnetic field value, either of two options can be chosen. According to the prior art, the magnetic field value would be doubled by doubling the current in the column line 34, as shown in part (b) of FIG. 6. The power needed to generate the magnetic field 2H is then $R \cdot (2I)^2$, and the power efficiency is $(R \cdot (2I)^2)/(2H)$, or thus $(2 \cdot R \cdot I^2)/H$. According to the present invention, however, a current I is sent through the column line 34, and a corresponding return current is sent through a return path line 35. The power needed to generate the magnetic field 2H is for this embodiment $(R \cdot I^2 + R \cdot I^2)$, and the power efficiency is $(R \cdot I^2 + R \cdot I^2)/(2H)$, or thus $(R \cdot I^2)/H$. This means that by using a functional return path 35 according to the present invention, i.e. a return path which substantially contributes to the generation of a magnetic field in a selected memory cell, magnetic fields generated in the magnetic memory cells 31 are doubled for a same power consumption.

According to a further embodiment of the present invention, flux guiding cladding layers 60 (part (d) of FIG. 6) may be provided at the column lines 34, at the return path lines 35 and/or at the row lines 33. These flux guiding cladding layers 60 are of a high permeability and magnetically soft (low coercivity), such as e.g. nickel iron (NiFe). These flux guide cladding layers 60 lead to a better localization of the magnetic field into the area of the selected cell. A gain of factor 2 in field magnitude can be realized this way. Moreover, the selectivity to neighboring memory elements 32 is enhanced, and thus cross-talk in neighboring memory elements 32 is reduced by using such flux guiding cladding layers 60. The flux guiding cladding layer 60 may cover only one side of a row line 33, column line 34, and/or return path line 35, preferably the side away from the memory element 32, or it may cover up to three sides thereof (as shown in part (d) of FIG. 6) for maximum efficiency.

According to a further embodiment of the present invention, a current is sent through a selected column line 34, and returned to the two adjacent column lines 70, 71 (one at either side of column line 34), and a part through each of the adjacent column lines 70, 71, e.g. one half of the current through each of those adjacent column lines 70, 71. By adding a connection scheme, as represented in FIG. 5, at the end of the matrix 30 where the current source 36 is not provided, bipolar return current paths can easily be formed, and a bit-serial write operation can be performed. By doing this, for an ultra-high density packing, the effective magnetic field at neighboring elements is reduced. The power consumption is $(R \cdot (I/2)^2 + R \cdot I^2 + R \cdot (I/2)^2)$, or thus $3/2 \cdot R \cdot I^2$. This means that the effective power consumption of this embodiment is increased with 50% with regard to the prior art embodiment as depicted in part (a) of FIG. 6. However, cross-talk is reduced, roughly by a factor 2. The maximum magnetic field in the selected memory cell is slightly reduced.

Figure 8:
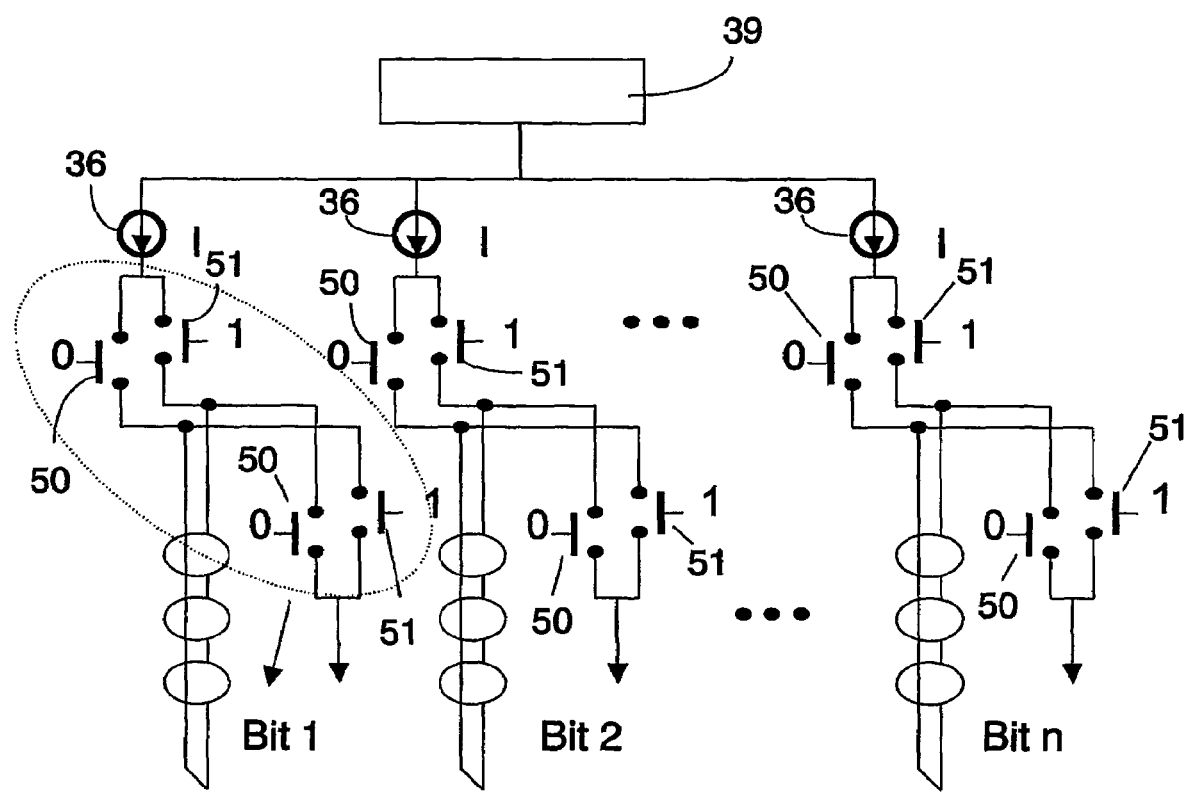
FIG. 8 is a schematic diagram of an MRAM architecture according to the present invention for word-parallel write operations.

Different bit-specific current source/sink units according to any of the embodiments of the present invention can be combined into a larger entity for word-parallel writing. This is schematically represented in FIG. 8. The current driver is then simply responding to the data to be written in the following way. In e.g. an 8-bit version, upon receipt of the word 10010110, the switches 50, 51 are closed for the sequence of bits in an appropriate way so as to be able to write the sequence 1-0-0-1-0-1-1-0 in subsequent bits. It is to be noticed that every column of bits requires four switches in this scheme, hence two switches are selected for each bit value in the word.

Power consumption, peak current and write time are analyzed for this architecture.

If the return path would not contribute to the magnetic field, but would simply double the resistance of the current line with respect to the conventional case, then it is found that for a 1-cycle write operation that the power consumption equals $$n \cdot (2R) \cdot I^2 + R \cdot I^2 = (2n+1) \cdot R \cdot I^2.$$

The first term, $n \cdot (2R) \cdot I^2$, is the power dissipated by the column lines and their return paths; the second term, $R \cdot I^2$, is the power dissipated by the row line (for clarity purposes not represented in FIG. 8) corresponding to the bits to be written. The power consumption in this case is thus higher than for the conventional case. The peak current is $$(n+1) \cdot I.$$

A multi-phase clock system can be implemented, as disclosed in U.S. Pat. No. 6,236,611, reducing the peak current to 2I, but the power consumption is now $$n((2R) \cdot I^2 + R \cdot I^2) = n \cdot 3 \cdot R \cdot I^2.$$

As explained before, according to the present invention only half of the current is needed in the current loop to achieve the same magnetic field value, since the return path participates equally in the field generation. However, the current line resistance is doubled, as its length is. In a 1-cycle write operation, the power consumption now equals $$n \cdot (2R) \cdot \left(\frac{I}{2}\right)^2 + R \cdot I^2 = \left(\frac{n}{2} + 1\right) \cdot R \cdot I^2.$$

As could be expected, this value is roughly half compared to state-of-the-art MRAM architectures. The peak current is now $$\left(\frac{n}{2} + 1\right) \cdot I$$

If a multi-phase clock is implemented, the peak current is reduced to $$\frac{3}{2} \cdot I$$

per cycle. However, the total power consumption after n-cycles is increased to $$n \cdot \left((2R) \cdot \left(\frac{I}{2}\right)^2 + R \cdot I^2\right) = n \cdot \frac{3}{2} \cdot R \cdot I^2.$$

Thus a return current path only leads to a reduction in power consumption if the 'return' current contributes to the magnetic field generation. The optimum will be at equal contribution of both current components. A break-even point with conventional technology is found for ~30% contribution of the return current path to the field generation. In any other case, one has to make sure that the extra resistance caused by the return path is kept minimal.

Figure 9:
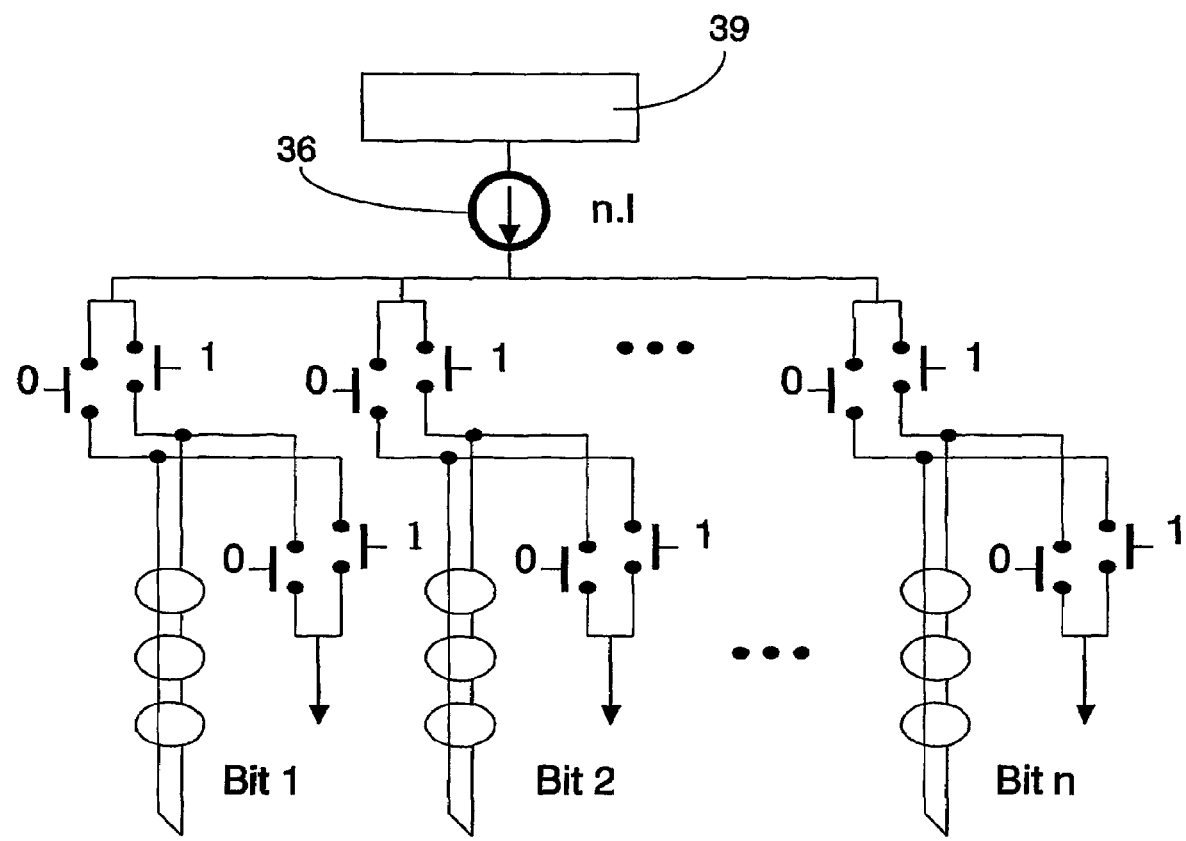
FIG. 9 is a schematic diagram of a further embodiment of the present invention with a single current source for simultaneously providing an equally distributed current to different bits in a word.

According to an embodiment of the present invention, making use of the intrinsic resistance equality in the different channels, a single current source (with level ~n·I) may be used, rather than n different smaller current sources (level ~I). The principle is sketched in FIG. 9. The decision about the ultimate implementation should be based on a smaller variation in the current line resistance values, rather than the different current source levels. In other words, when the statistical variation in the resistance of the different current loops is very small, a single current source built around an enlarged-gate transistor may give a better control over the current levels in the different loops.

The current source/sink unit may be improved in another manner. FIG. 10 clearly shows the serial approach by feeding the current sink of the first bit into the current source of the second bit, etc. If each of the switches 50, 51 are appropriately switched, the right content can be written for each of the bits, as shown in the bottom part of FIG. 10. Therefore, a smaller current source 36 proves to be adequate, thus saving substrate area, e.g. silicon area. However, the power consumption cannot immediately be reduced due to the extended current line (factor n). For a 1-cycle write operation, a peak current of only 3/2·I is required. In this approach, the advantages of a smaller power consumption are combined with a fast write time and a low peak current. In a modular approach for MRAM, smaller memory banks or blocks may be used to reduce the overall current line resistance. This is typically done to reduce voltage losses over the current lines.

According to yet another embodiment of the present invention, a better uniformity of the magnetic field throughout the memory element may be created. The requirement of using minimal line width is relaxed in this embodiment. Of course, such an implementation will lead to a loss of density for MRAM arrays. However, it may be advantageous to trade off density for improved magnetic field uniformity.

Different situations, represented in parts (a) to (e) of FIG. 11 are compared. Part (a) represents a single current line 34, according to the prior art. Part (b) represents a current line 34 with a return path 35 above the magnetoresistive element 32 according to the first embodiment of the present invention described hereinabove. The magnetoresistive element 32, the current line 34 and the return path 35 all have the same width, and all elements 32, 34, 35 are placed symmetrically with respect to each other. Part (c) represents a current line 34 with a return path 35, whereby both the current line 34 and the return path 35 are extended to have a width which corresponds to 1.5 times the width of the memory element 32, and whereby the conductors 34, 35 are offset with regard to the memory element 32. Part (d) is as part (c), but whereby the conductors 34, 35 are extended so as to have a width, which is twice the width of the memory element 32. Part (e) is as part (d), but whereby the conductors 34, 35 are placed symmetrically with respect to the magnetoresistive element 32. Table 1 gives an overview of the input parameters in the calculation for both lines. These values are taken from a typical CMOS090 process flow.

TABLE 1

|     |             | Width line | Height line | Distance line to memory element |
|-----|-------------|------------|-------------|--------------------------------|
| (a) | Bottom line | 200 nm     | 325 nm      | 110 nm                         |
|     | Top line    | /          | /           | /                              |
| (b) | Bottom line | 200 nm     | 325 nm      | 110 nm                         |
|     | Top line    | 200 nm     | 250 nm      | 400 nm                         |
| (c) | Bottom line | 300 nm     | 325 nm      | 110 nm                         |
|     | Top line    | 300 nm     | 250 nm      | 400 nm                         |
| (d) | Bottom line | 400 nm     | 325 nm      | 110 nm                         |
|     | Top line    | 400 nm     | 250 nm      | 400 nm                         |
| (e) | Bottom line | 400 nm     | 325 nm      | 110 nm                         |
|     | Top line    | 400 nm     | 250 nm      | 400 nm                         |

Table 2 gives an overview of calculated magnetic fields, power consumption, required currents, power efficiency, maximum current gain factor and maximum possible magnetic field for the different embodiments represented in FIG. 11.

TABLE 2

|  | (a) | (b) | (c) | (d) | (e) |
|---|---|---|---|---|---|
| Magnetic field (kA/m/mA) | 0.782 | 1.522 | 1.458 | 1.410 | 1.322 |
| Power consumption | $R \cdot I^2$ | $2 \cdot R \cdot I^2$ | $2 \cdot (2/3\, R) \cdot I^2$ | $2 \cdot (1/2\, R) \cdot I^2$ | $2 \cdot (1/2\, R) \cdot I^2$ |
| Required current for generating H = 0.5 kA/m | 0.639 | 0.328 | 0.343 | 0.355 | 0.378 |
| Power efficiency (R = 1) | 0.817 | 0.430 | 0.314 | 0.252 | 0.286 |
| Power consumption | 100% Prior art | 52.6% | 38.4% | 30.8% | 35.0% |
| Max. current gain factor | 1× | 1× | 1.5× | 2× | 2× |
| Max. field for I = 1 mA (kA/m) | 0.782 | 1.522 | 2.187 | 2.820 | 2.644 |

The calculated magnetic field is represented in FIG. 12, in function of distance from the memory element. The letters associated with the graphs refer to each of the cases represented in FIG. 11. Using the same current in all situations, a small reduction in the magnetic field is observed when using wider lines (embodiments (c), (d) and (e)). However, the power efficiency is much improved due to the reduced current line resistance. Moreover, due to the larger cross-section, higher fields can now be generated for constant current density. The power consumption can be reduced with about a factor of at least two to three.

FIG. 13 illustrates enhanced field uniformity for wider current lines in function of distance from the memory element. The letters associated with the graphs refer to each of the cases represented in FIG. 11. For the same current, asymmetrical current lines, i.e. embodiments (c) and (d) give rise to higher obtainable magnetic fields, in comparison to the symmetrical embodiment (e). The gain in magnetic field for asymmetrical current lines, however, is tampered by a small reduction in field uniformity.

A few different layouts for a 0T-1MTJ MRAM device using active field shaping according to the present invention are shown in FIG. 14. To minimize write fields, minimal dimensions (for a given technology, i.e. e.g. 200×100 nm$^2$ for CMOS090) are combined, for the memory elements 32, e.g. magnetic tunnel junctions, with a write line or column line 34 of 400 nm rather than 200 nm for the vertical write lines. Different implementations of the horizontal write lines or row lines 33 can be envisaged, as shown in FIG. 14.

In first instance, a prior art architecture is represented, a top view in part (1a) of FIG. 14 and a cross-section in part (1b) thereof. No functional current return paths are provided, for the column lines 34 nor for the row lines 33.

The first embodiment of the present invention is also illustrated in parts (2a) and (2b) of FIG. 14, which are a top view and a vertical cross-sectional view of a device according to this embodiment, respectively. Double symmetrical return lines are provided, i.e. a column return line 35 is provided for each column line 34 and associated therewith and a row return line 80 is provided for each row line 33 an associated therewith. A column line 34 and its associated column return line 35 are placed symmetrically with respect to the memory element 32, and a row line 33 and its associated row return line 80 are also placed symmetrically with respect to the memory element 32, as can be seen in the cross-sectional view (2b).

Another embodiment of the present invention is illustrated in parts (3a) and (3b) of FIG. 14, which are a top view and a vertical cross-sectional view of a device according to this embodiment, respectively. Vertical asymmetrical return lines and horizontal symmetrical return lines are provided, i.e. a column return line 35 is provided for each column line 34 and associated therewith and a row return line 80 is provided for each row line 33 an associated therewith. A column line 34 and its associated column return line 35 are placed asymmetrically with respect to the memory element 32, as can be seen in part (3b) of FIG. 14, i.e. there is an offset between column line 34 and memory element 32 in the direction in which the row lines 33 extend and between return line 35 and memory element 32 in the direction in which the row lines 33 extend. In this embodiment, a row line 33 and its associated row return line 80 are placed symmetrically with respect to the memory element 32, as can be seen in part (3a) of FIG. 14.

Yet another embodiment of the present invention is illustrated in parts (4a) and (4b) of the present invention, which are a top view and a vertical cross-sectional view of a device according to this embodiment, respectively. Vertical asymmetrical return lines and horizontal asymmetrical return lines are provided, i.e. a column return line 35 is provided for each column line 34 and associated therewith and a row return line 80 is provided for each row line 33 an associated therewith. A column line 34 and its associated column return line 35 are placed asymmetrically with respect to the memory element 32, as can be seen in part (4b) of FIG. 14, i.e. there is an offset between column line 34 and memory element 32 in the direction in which the row lines 33 extend and between return line 35 and memory element 32 in the direction in which the row lines 33 extend. In this embodiment, also a row line 33 and its associated row return line 80 are placed asymmetrically with respect to the memory element 32, as can be seen in part (4a) of FIG. 14, i.e. there is an offset between row line 33 and memory element 32 in the direction in which the column lines 34 extend and between row return line 80 and memory element 32 in the direction in which the column lines 34 extend.

Figure 1:
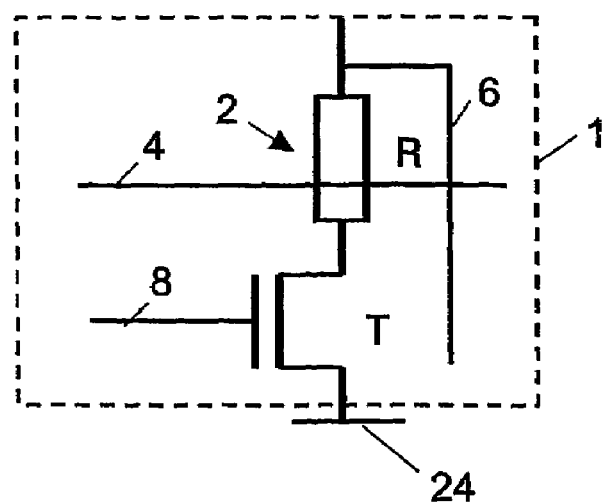
FIG. 1 is an electrical representation of an MRAM unit for connection in an array according to the prior art.
Figure 2:
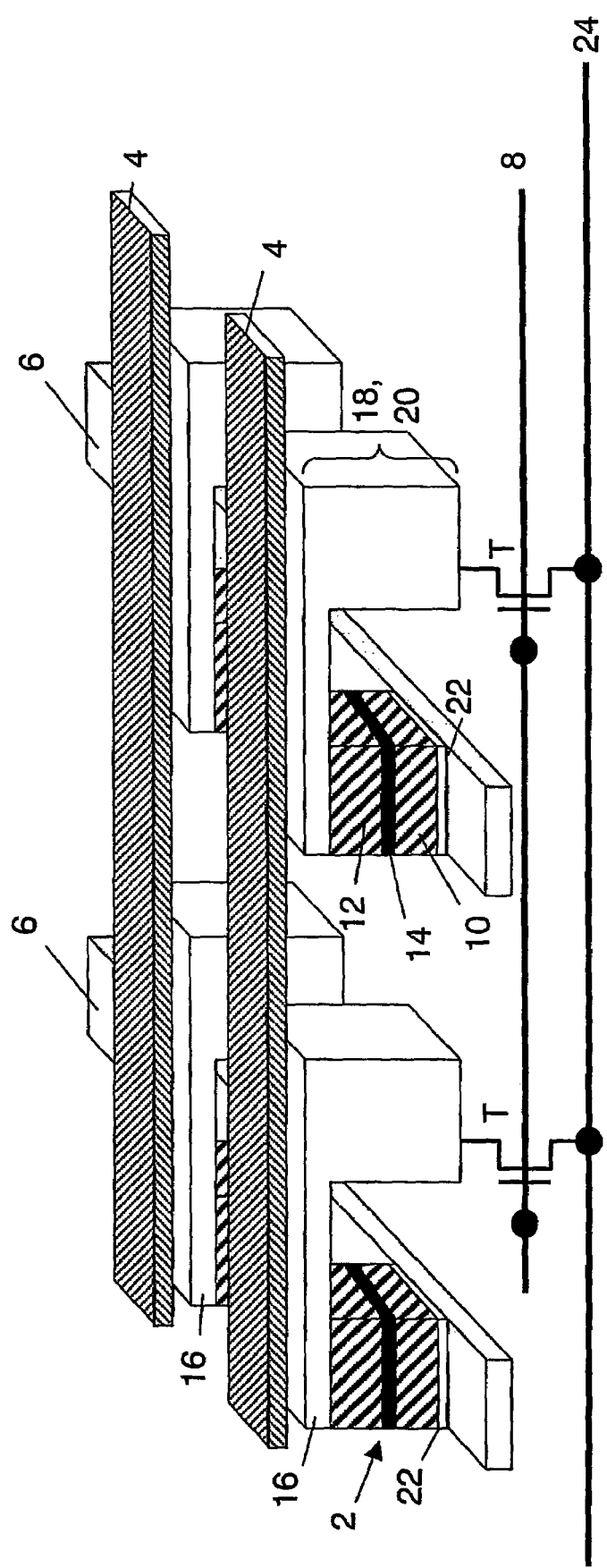
FIG. 2 is a diagrammatic elevational view of a 2×2 array of MTJ units according to the prior art.

The influence on the cell size is represented by the rectangular boxes 90 in FIG. 14, which represent a unit cell. The results are as follows: embodiments of FIG. 14, 1a and 2a have a cell size of 6F$^2$, the embodiment of FIG. 14, 3a has a cell size of 10F$^2$ and the embodiment of FIG. 14, 4a has a cell size of 15F$^2$.

With respect to cross-talk reduction, two methods can be implemented according to the present invention: in first instance double symmetrical return lines in combination with extra currents through neighboring lines, or in second instance use of wider symmetrical or asymmetrical return lines. The first method requires ~50% extra power consumption, whereas the second way requires ~100% extra space. In the latter case, the cross-talk is reduced from 40% to 27% and 22% for symmetrical or asymmetrical return lines respectively, without loss of peak magnetic field.

It is to be understood that although preferred embodiments, specific constructions and configurations, as well as materials, have been discussed herein for devices according to the present invention, various changes or modifications in form and detail may be made without departing from the scope and spirit of this invention. For example, the above concept, although illustrated for 0T-1MTJ MRAM devices, can be implemented in 1T-1MTJ or other MRAM structures.

The invention claimed is:

1. A matrix with magnetoresistive memory cells logically organized in rows and columns, each memory cell including a magnetoresistive element, the matrix comprising a set of column lines, a column line being a continuous conductive strip which is magnetically coupled to the magnetoresistive element of each of the memory cells of a column, wherein each column line has a forward column line and a return column line arranged on opposite sides of the magnetoresistive element and offset from one another for forming a return path for current in that column line and for altering a magnetic field at a selected magnetoresistive element and generated by current flow in the column line for writing to the selected magnetoresistive element.

2. A matrix according to claim 1, further comprising a set of row lines, a row line being a continuous conductive strip which is magnetically coupled to the magnetoresistive element of each of the memory cells of a row.

3. A matrix according to claim 2, wherein each row line has a forward row line and a return row line for forming a return path for current in that row line and for altering a magnetic field at the selected magnetoresistive element.

4. A matrix according to claim 2, wherein for each row line, two adjacent row lines are used for forming a return path for current in that row line and for altering the magnetic field of a selected magnetoresistive element.

5. A matrix according to claim 4, wherein the return row lines are provided with a flux guiding cladding layer.

6. A matrix according to claim 2, wherein the row lines are provided with a flux guiding cladding layer.

7. A matrix according to claim 1, wherein the column of magnetoresistive elements is placed offset in a row-direction with regard to the center of the column lines.

8. A matrix according to claim 1, wherein the column of magnetoresistive elements is placed offset in a row-direction with regard to the center of the return column lines.

9. A matrix according to claim 1, wherein the column of magnetoresistive elements is placed symmetrically with regard to both the column line and at least one return column line.

10. A matrix according to claim 1, wherein the column lines or the return column lines are provided with a flux guiding cladding layer.

11. A matrix according to claim 1, wherein the matrix is used as a nonvolatile memory array.

12. A method of writing a magnetoresistive element in a matrix of magnetoresistive memory elements arranged in logically organized rows and columns, comprising:
    combining, in the magnetoresistive element, a magnetic field from a current line with a magnetic field from at least one return current line arranged on an opposite side of the magnetoresistive element and offset from the magnetoresistive element to thereby increase the magnetic field for writing to the magnetoresistive element.

* * * * *